United States Patent
Remington

(10) Patent No.: US 7,791,389 B2
(45) Date of Patent: Sep. 7, 2010

(54) STATE RETAINING POWER GATED LATCH AND METHOD THEREFOR

(75) Inventor: Scott I. Remington, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 134 days.

(21) Appl. No.: 12/022,193

(22) Filed: Jan. 30, 2008

(65) Prior Publication Data

US 2009/0189664 A1 Jul. 30, 2009

(51) Int. Cl.
*H03K 3/356* (2006.01)
(52) U.S. Cl. .................. 327/208; 327/202; 327/203
(58) Field of Classification Search ............. 327/202, 327/208
See application file for complete search history.

(56) References Cited

U.S. PATENT DOCUMENTS

| 6,775,180 | B2 |  | 8/2004 | Biyani et al. |
| 6,882,201 | B1 | * | 4/2005 | Koch et al. ............. 327/199 |
| 6,965,261 | B2 |  | 11/2005 | Tran et al. |
| 7,123,068 | B1 | * | 10/2006 | Hoover et al. .......... 327/202 |
| 7,164,301 | B2 |  | 1/2007 | Chun |
| 7,221,205 | B2 | * | 5/2007 | Kinkade et al. ......... 327/203 |
| 2004/0051574 | A1 |  | 3/2004 | Ko et al. |
| 2006/0197571 | A1 |  | 9/2006 | Kim |
| 2006/0267654 | A1 |  | 11/2006 | Gururajarao et al. |
| 2007/0085585 | A1 |  | 4/2007 | Frederick |
| 2008/0218234 | A1 | * | 9/2008 | Jain ....................... 327/202 |

OTHER PUBLICATIONS

PCT Application No. PCT/US2008/088622; Search Report and Written Opinion mailed Oct. 1, 2009.

* cited by examiner

*Primary Examiner*—Lincoln Donovan
*Assistant Examiner*—John W Poos
(74) *Attorney, Agent, or Firm*—Daniel D. Hill; James L. Clingan, Jr.

(57) ABSTRACT

A circuit has first latch, a second latch, a coupling circuit, and a power down circuit. The first latch has an input/output coupled to a data node. The second latch has an input/output. The coupling circuit is coupled between the input/output of the second latch and the data node. The coupling circuit is enabled during a normal operation of the circuit and disabled during a power down mode of the circuit. The power down control circuit is for disabling the first latch during the power down mode and for a time period after a transition from the power down mode to the normal operation. This allows the second latch to set the state of the first latch when transitioning from the power down mode to the normal mode. Thus normal operation can be fast, and the power down mode can have low leakage current.

20 Claims, 3 Drawing Sheets

STATE RETAINING POWER GATED LATCH AND METHOD THEREFOR

BACKGROUND

1. Field

This disclosure relates generally to latches, and more specifically, to a state retaining power gated latch and method therefor.

2. Related Art

Lower power consumption has been gaining importance in integrated circuit data processing systems due to, for example, wide spread use of portable and handheld applications. Most circuits in handheld devices are typically off (e.g., in an idle or deep sleep mode) for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

One method that has been used to reduce leakage current of integrated circuits is to increase the threshold voltage of the transistors in the device. However, simply increasing the threshold voltage of the transistors may result in unwanted consequences such as slowing the operating speed of the device and limiting circuit performance. Typically, a lower leakage transistor is formed using a relatively thicker gate dielectric and/or an increased channel length.

Another method that has been used to reduce leakage current is to "power gate", or cut off power to certain blocks of the integrated circuit that are not needed when the device is in a low power mode. However, in doing so, the state of the circuit block is lost. One or more state retention circuits are used to prevent loss of important information and allow for proper circuit operation and performance when recovering from a low power mode. A typical state retention circuit includes a latch circuit implemented using low leakage transistors. During a low power mode, the last logic state before power down is retained in one or more of the latch circuits while the rest of the integrated circuit is powered down. To further reduce power consumption, the power supply voltage to the state retention latch circuit may be lowered. When normal operation is resumed, the logic state of the state retention latch is used to recover the system state.

During normal operation, the state retention latch functions as a normal latch. However, because the state retention latch is implemented with lower leakage transistors, the state retention latch requires a relatively longer setup time. A setup time of a latch is the minimal amount of time required to change the logic state stored in the latch. The relatively long setup time can limit the operating frequency of the integrated circuit.

Therefore, what is needed is a state retention latch that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
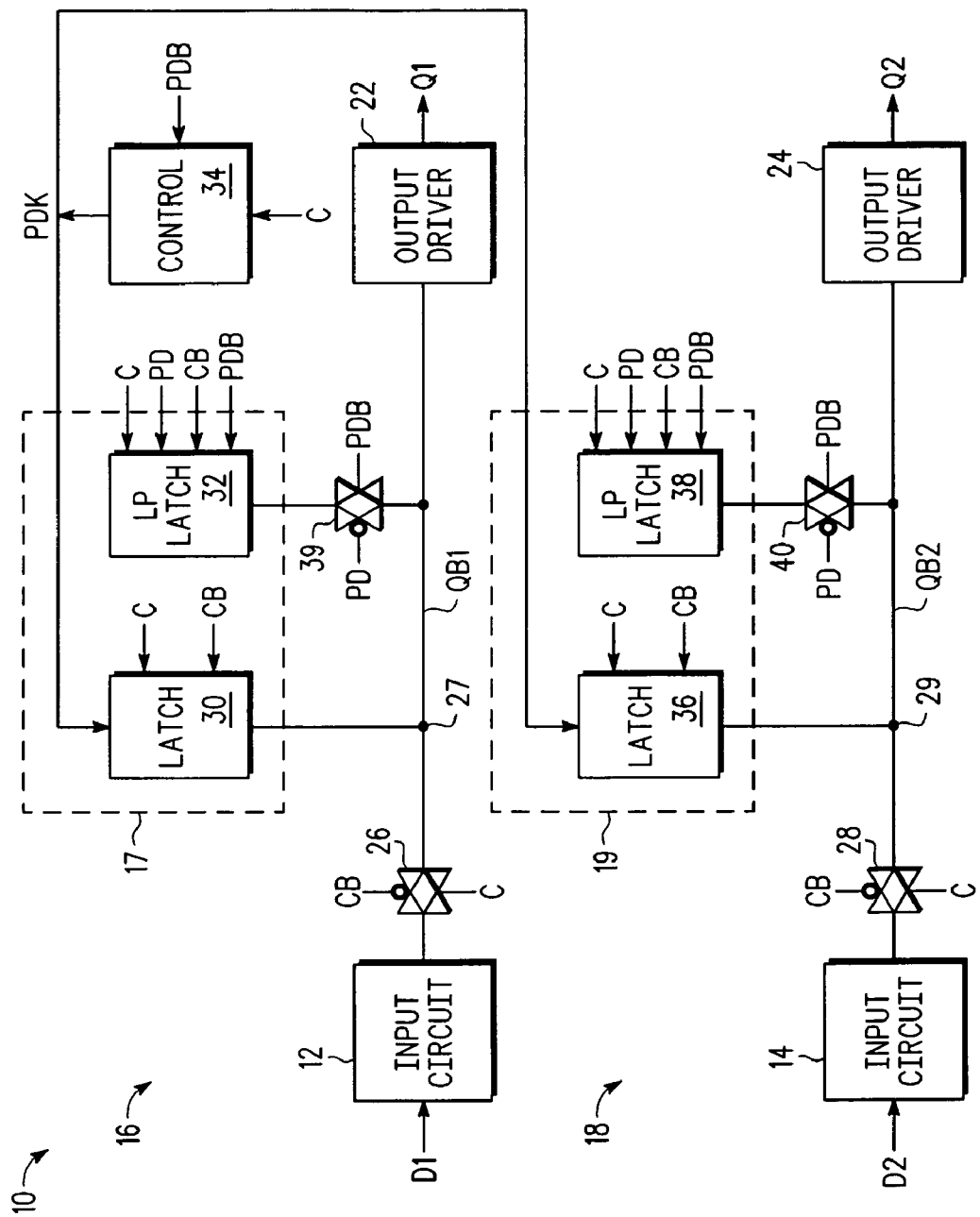
FIG. 1 illustrates, in block diagram form, two data paths of an integrated circuit in accordance with an embodiment.

Generally, the present invention provides a latching circuit having a state retention latch and a "keeper" latch in parallel with the state retention latch. The state retention latch is implemented with low leakage transistors for storing a logic state during a power down mode. The keeper latch is implemented with faster switching and higher leakage transistors for more quickly storing an input logic state than the state retention latch. The keeper latch is unpowered during power down mode. When the integrated circuit returns to a normal operating mode, the state retention latch restores the logic state that was present at the output before power down. The second latch is recovered from power down mode after a predetermined delay to avoid contention with the state retention latch. Implementing the faster keeper latch in parallel with the state retention latch allows setup times to be shorter during a normal functional operating mode, thus allowing the integrated circuit to operate at a higher frequency.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or by the letter "B" following the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

In one aspect, there is provided, a circuit, comprising: a first latch having an input/output coupled to a data node; a second latch having an input/output; a coupling circuit is coupled between the input/output of the second latch and the data node and is enabled during a normal operation of the circuit and disabled during a power down mode of the circuit; and a power down control circuit for disabling the first latch during the power down mode and for a time period after a transition from the power down mode to the normal operation. The first latch may comprise transistors having a lower threshold voltage than transistors that comprise the second latch. The first latch may be characterized as having a first write time; and the second latch may be characterized as having a second write time, where the first write time is faster than the second write time. The second latch may comprise transistors having a lower current leakage than transistors that comprise the first latch. The first latch may have power removed during the power down mode and restored at the transition from the power down mode to the normal operation. In the normal operation, the first latch and the second latch may alternate between being written and latching in response to a clock signal switching between first and second logic states, respectively. The time period may be a duration of the first logic state immediately following the transition from the power down mode to the normal operation. The clock signal has cycles divided into first half cycles and second half cycles, wherein the clock signal is in a first logic state during the first half cycles and in a second logic state during the second half cycles; the first and second latches receive data present on the data node during the first half cycles and keep the data in a latched condition during the second half cycles. The power down control circuit may comprise a set/reset latch having a set input for receiving a signal that is active in response to a transition from normal operation to the power down mode, a reset input for receiving the clock signal, and an output; and the first latch has an input coupled to the output of the set/reset latch. The clock signal may be at a beginning of a second half cycle that is extendible when a transition from the power down mode to the normal operation occurs. The power down control circuit may provide a power down keep signal for use in performing the disabling. There may be a plurality of data nodes having pairs of keeper latches coupled thereto, wherein each pair has one keeper latch for receiving the power down keep signal.

In another aspect, there is provided, a circuit having a normal mode and a power down mode, comprising: a first input circuit having an output; a first transmission gate enabled by a clock signal having a first terminal coupled to the output of the first input circuit and a second terminal; a first latch powered during the normal mode and unpowered during the power down mode having an input/output coupled to the second terminal of the first transmission gate and an enable input; a second transmission gate that is enabled during the normal mode and disabled during the power down mode having a first terminal coupled to the second terminal of the first transmission gate and a second terminal; a second latch enabled during power down mode and during normal mode having an input/output coupled to the second terminal of the second transmission gate; and a power down control circuit providing a power down keep signal coupled to the enable input of the first latch to keep the first latch disabled until after a time period after a transition from the power down mode to the normal mode. The first latch may comprise transistors having a first threshold voltage; and the second latch may comprise transistors having second threshold voltage greater than the first threshold voltage. The first latch may have a first write speed; and the second latch may have a second write speed slower than the first write speed. The first latch may comprise transistors characterized as having a first current leakage; and the second latch may comprise transistors characterized as having a second current leakage that is less than the first current leakage. The circuit may comprise a third transmission gate enabled by the clock signal having a first terminal coupled to the output of the second input circuit and a second terminal; a third latch powered during the normal mode and unpowered during the power down mode having an input/output coupled to the second terminal of the third transmission gate and an enable input; a fourth transmission gate that is enabled during the normal mode and disabled during the power down mode having a first terminal coupled to the second terminal of the third transmission gate and a second terminal; and a fourth latch enabled during power down mode and during normal mode having an input/output coupled to the second terminal of the fourth transmission gate, wherein: the power down control circuit provides the power down keep signal coupled to the enable input of the third latch to keep the third latch disabled until after the time period after the transition from the power down mode to the normal mode.

In yet another aspect, there is provided, in a circuit having a normal mode and a power down mode and having a first latch and a second latch, a method comprising: writing data into the first latch and the second latch through a data node during a first half cycle of a clock signal that occurs during the normal mode; latching data from the data node in the first latch and the second latch during a second half cycle of the clock signal that occurs during the normal mode; disabling the first latch in response to entering the power down mode; keeping the data latched in the second latch during the power down mode and a time period after a transition from the power down mode to the normal mode; and enabling the first latch after a time period after the transition from the power down mode to the normal mode. The step of enabling may be further characterized by the time period being the duration of the second half cycle which is extendible after the transition from the power down mode to the normal mode. The method may further comprise: removing power from the first latch in response to the transition from the normal mode to the power down mode; and applying power to the first latch in response to the transition from the power down mode to the normal mode.

FIG. 1 illustrates, in block diagram form, a portion 10 of an integrated circuit having two data paths in accordance with an embodiment. The portion 10 includes a data path 16 and a data path 18. Data path 16 includes input circuit 12, transmission gate 26, state retaining latch circuit 17, latch control circuit 34, transmission gate 39, and output driver 22. State retaining latch circuit 17 includes keeper latch 30 and low power latch 32. Data path 18 includes input circuit 14, transmission gate 28, state retaining latch circuit 19, transmission gate 40, and output driver 24. State retaining latch circuit 19 includes keeper latch circuit 36 and low power latch circuit 38. A control circuit 34 is coupled to latch 30 of data path 16 and latch 36 of data path 18. The control circuit 34 disables keeper latches 30 and 36 when integrated circuit 10 transitions from normal mode to power down mode and keeps latches 30 and 36 disabled during power-up so that latches 30 and 36 do not overwrite low power latches 32 and 38, respectively. Note that even though two data paths are illustrated in FIG. 1, other embodiments may have only one data path or more than two data paths. Control circuit 34 can be used to control any number of state retaining latch circuits.

In data path 16, input circuit 12 has an input terminal for receiving an input signal labeled "D1", and an output terminal. The input signal D1 can be either a logic high signal representing a logical one or a logic low signal representing a logical zero. Input circuit 12 can be any type of logic circuit or a combination of logic circuits. For example, in one embodiment, input circuit 12 is an inverter. In another embodiment, input circuit 12 can be a latch. Transmission gate 26 has an input terminal coupled to the output terminal of the input circuit, an output terminal coupled to internal data node 27 for providing a signal labeled "QB1", and first and second control terminals for receiving clock signals labeled "C" and "CB". Note that the letter "B" after a signal name indicates that the signal is a logical complement of a signal having the same name but lacking the "B". The clock signal has cycles divided into first half cycles and second half cycles, where the clock signal is in a first logic state during the first half cycles and in the second logic state during the second half cycles. In one embodiment, transmission gate 26 can be a single pass transistor and in another embodiment, transmission gate 26 can include parallel-connected N-channel and P-channel transistors. Latch circuit 30 has an input/output terminal coupled to the output terminal of transmission gate 26 at node 27, first and second input clock terminals for receiving clock signals C and CB, and a control terminal for receiving a control signal labeled "PDK". Transmission gate 39 has a first terminal coupled to node 27, a second terminal, and first and second control terminals for receiving power down control signals labeled "PD" and "PDB". Low power (LP) latch circuit 32 has an input/output terminal coupled to the second terminal of transmission gate 39, first and second clock terminals for receiving clock signals C and CB, and first and second control terminals for receiving control signals PD and PDB. Output driver circuit 22 has an input coupled to node 27, and an output for providing an output signal labeled "Q1". Output driver 22 does not necessarily provide signal Q1 external to integrated circuit 10. Note that even though signal Q1 is a logical complement of signal QB1 in the illustrated embodiment, signal Q1 does not have to be the logical complement of signal QB1 in other embodiments.

Control circuit 34 has a first input terminal for receiving clock signal C, a second input terminal for receiving power down control signal PDB, and an output terminal for providing a power down keeper signal labeled "PDK" to control inputs of latch circuit 30 of data path 16 and latch circuit 36 of data path 18. In other embodiments, control circuit 34 can be used to temporarily disable any number of keeper latch circuits when transitions from power down mode to normal mode occur. In the illustrated embodiment (see FIG. 2), control circuit 34 is an SR (set/reset) latch where the reset (R) function is provided by clock signal C and the set (S) function is provided by control signal PDB. In other embodiments, control circuit 34 may be implemented in other ways. Also, in the illustrated embodiment, the elements of data path 18 are coupled together in the same manner as those of data path 16. In alternate embodiments, there may be differences between data path 16 and data path 18.

In the illustrated embodiment, latch circuit 30 is implemented on an integrated circuit using a conventional CMOS (complementary metal oxide semiconductor) process for providing relatively high speed operation, and LP latch circuit 32 is implemented using a low leakage CMOS process. As compared to the transistors of latch circuit 30, the transistors of latch circuit 32 are characterized as being low power transistors and have a thicker gate dielectric, a wider channel region, and higher threshold voltage to reduce leakage current at the expense of switching speed. That is, the low power transistors do not change from on to off or from off to on as quickly, and therefore cannot operate at the same high frequencies as normal CMOS transistors. This can limit the maximum frequency at which the integrated circuit can reliably function. To allow low leakage operation during power down mode, and to provide high speed operation during normal mode, latch 30 is coupled to node 27 in parallel with LP latch 32. Latch 30 is implemented with high speed, relatively high leakage, CMOS transistors to allow signal QB1 to be provided faster during normal mode. During power down mode, the signal QB1 is stored by the low leakage transistors of LP latch 32 while latch 30 is disabled and powered down.

More specifically, during normal operation, input signal D1 is provided to input circuit 12. Input circuit 12 can be any type of logic circuit. In response to the clock signal C being a logic high, the signal from input circuit 12, as modified by input circuit 12, is passed through transmission gate 26 to node 27 as signal QB1. Signal QB1 is stored in latches 30 and 32 in response to clock signal C and CB during normal mode. During normal mode, power down signal PD is deasserted, or negated, as a logic low so transmission gate 39 is conductive to allow the logic state of signal QB1 to be stored in LP latch 32 every time the clock signal is a logic high. Both latches 30 and 32 alternate between being written and storing the logic state of signal QB1 in response to clock signals C and CB. Latches 30 and 32 receive data present at node 27 during the first half cycle of clock signals C and CB and keep the data in a latched condition during the second half cycle of clock signals C and CB. However, because the transistors of latch 30 are not low power transistors, they can operate faster than the transistors of LP latch 32, thus reducing the setup time of the integrated circuit. In other words, latch 30 has a faster write time than LP latch 32.

As discussed above, the setup time of a latch is the minimal amount of time required to change the logic state stored in the latch. When the integrated circuit enters power down, or low power, mode, a power supply voltage is removed from every circuit element except LP latch 32 and control circuit 34. When the power supply voltage is restored while returning to normal mode from power down mode, power down keeper signal PDK from circuit 34 disables latch 30 for a predetermined amount of time to prevent latch 30 from overwriting LP latch 32. The predetermined amount of time is just enough time for LP latch 32 to set the state of node 27 following the transition from power down mode to normal mode.

Note that in the illustrated embodiment, the circuits of data path 18 operate the same as the circuits of data path 16.

Figure 2:
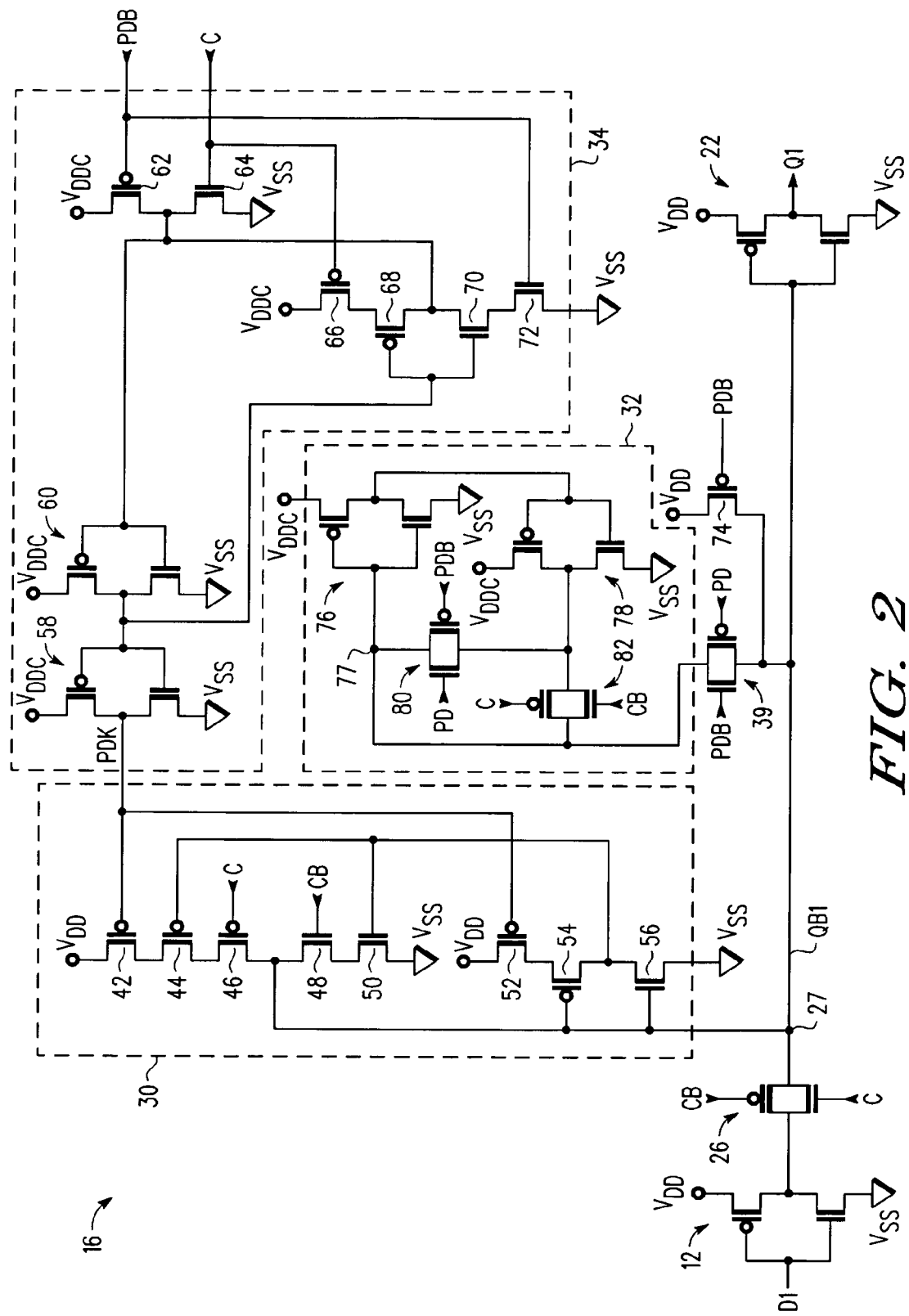
FIG. 2 illustrates, in schematic diagram form, one of the two data paths of FIG. 1 in more detail.

FIG. 2 illustrates, in schematic diagram form, data path 16 of FIG. 1 in more detail. Data path 16 includes input circuit 12, transmission gates 26 and 39, latch 30, LP latch 32, control circuit 34, transistor 74, and output driver 22. Latch 30 includes P-channel transistors 42, 44, 46, 52, and 54, and N-channel transistors 48, 50, and 56. LP latch 32 includes transmission gates 80 and 82, inverters 76 and 78. Control circuit 34 includes inverters 58 and 60, P-channel transistors 62, 66, and 68, and N-channel transistors 64, 70, and 72. Note that the boundaries drawn around the circuits in FIG. 2 are for convenience only and can be redrawn to include different elements without changing the functionality of the circuit. In latch 30, P-channel transistor 42 has a source coupled to power supply voltage terminal VDD, a gate coupled to receive power down keeper signal PDK, and a drain. P-channel transistor 44 has a source coupled to the drain of transistor 42, a gate, and a drain. P-channel transistor 46 has a source coupled to the drain of transistor 44, a gate for receiving clock signal C, and a drain coupled to node 27. N-channel transistor 48 has a drain coupled to node 27, a gate coupled to receive clock signal CB, and a source. N-channel transistor 50 has a drain coupled to the drain of transistor 48, a gate coupled to the gate of transistor 44, and a source coupled to power supply voltage terminal VSS. P-channel transistor 52 has a source coupled to VDD, a gate coupled to receive signal PDK, and a source. P-channel transistor 54 has a source coupled to the drain of transistor 52, a gate coupled to the drain of transistor 46, and a drain coupled to the gates of transistors 44 and 50. N-channel transistor 56 has a drain coupled to the drain of transistor 54, a gate coupled to node 27, and a source coupled to VSS.

In LP latch 32, inverter 76 has an input coupled to transmission gate 39, and an output. Inverter 78 has an input coupled to the output of inverter 76, and an output. Transmission gate 80 is coupled between the input terminal of inverter 76 and the output terminal of inverter 78. Transmission gate 80 is controlled by power down signals PD and PDB. Transmission gate 82 is coupled in parallel with transmission gate 80 and is controlled by clock signals C and CB. The transistors of latch circuit 32 are characterized as being low power transistors and have a thicker gate dielectric, a wider channel region, and higher threshold voltage than the other transistors of integrated circuit 10.

Inverter 12 represents one embodiment of input circuit 12 of FIG. 1. In other embodiments, the input circuit 12 may be different. Inverter 12 has an input for receiving signal D1, and an output coupled to an input of transmission gate 26. Internal data node 27 is coupled to the output of transmission gate 26, the input/output of each of latches 30 and 32, and to the input of inverter 22. When data path 16 is functioning in normal mode, transmission gate 39 is made conductive by a logic low power down signal PD. The logic state at node 27 is provided to the parallel connected transmission gates 80 and 82. During normal mode, transmission gate 80 is non-conductive and transmission gate 82 is conductive each time clock signal C becomes a logic low. Therefore, the logic state of the cross-coupled latch formed by inverters 76 and 78 is latched each time the clock signal is low.

When data path 16 is functioning in low power mode, power down signal PD is a logic high, causing transmission gate 39 to be non-conductive and transmission gate 80 to be conductive. The clock signal stops and the last logic state before power down is stored by cross-coupled inverters 78 and 76 through transmission gate 80.

In control circuit 34, P-channel transistor 62 has a source coupled to continuous power supply voltage terminal VDDC, a gate for receiving signal PDB, and a drain. N-channel transistor 64 has a source coupled to the drain of P-channel transistor 62, a gate for receiving clock signal C, and a drain coupled to VSS. P-channel transistor 66 has a source coupled to VDDC, a gate for receiving clock signal C, and a drain. P-channel transistor 68 has a source coupled to the drain of transistor 66, a gate, and a drain coupled to the drain of transistor 62. N-channel transistor 70 has a drain coupled to the drain of transistor 68, a gate coupled to the gate of transistor 68, and a source. N-channel transistor 72 has a drain coupled to the source of N-channel transistor 70, a gate coupled to receive power down control signal PDB, and a source coupled to VSS. Inverter 60 has an input coupled to the drains of P-channel transistors 62 and 68, and an output coupled to the gates of transistors 68 and 70. Inverter 58 has an input coupled to the output of inverter 60, and an output for providing power down keep signal PDK to the gates of transistors 42 and 52.

Control circuit 34 functions as an SR latch in the illustrated embodiment, where the SR reset signal is the illustrated clock signal C, and the set signal is the power down signal PDB. When power down signal PDB is a logic low (power down mode), transistor 62 is conductive, causing the input of inverter 60 to be a logic high, resulting in the output signal (PDK) of inverter 58 being a logic high. When signal PDK is a logic high, P-channel transistors 42 and 52 are substantially non-conductive, causing latch circuit 30 to be turned off. When PDB is a logic high (normal mode) transistor 62 is non-conductive and transistor 64 is conductive each time clock signal C is a logic high. The logic high clock signal C causes the input of inverter 60 to be low, thus causing keeper signal PDK to be low, and activating latch 30 to store the logic state provided to node 27. Also, the logic low input to inverter 60 causes the gates of both of transistors 68 and 70 to receive a logic high voltage. Transistors 70 and 72 are conductive providing a logic low to the input of inverter 60. Inverter 60 and transistors 68 and 70 function as a pair of cross-coupled inverters when transistors 66, 70, and 72 are conductive.

P-channel transistor 74 has a source coupled to VDD, a gate for receiving PDB, and a drain coupled to data node 27. Transistor 74 functions to allow node 27 to power up in a known state (a logic high) in response to power down signal PDB being asserted as a logic low. In another embodiment, transistor 74 may be implemented as an N-channel transistor having a gate for receiving power down signal PD and a source coupled to VSS. Inverter 22 has an input coupled to node 27, and an output for providing signal Q1. In another embodiment, inverter 22 may be replaced with another type of logic circuit. Data path 18 of FIG. 1 may be the same as or different than the embodiment of data path 16 as illustrated in FIG. 2.

Power supply voltage terminal VDDC is coupled to receive a positive power supply voltage that is continuously provided during normal operating mode and the power down mode. During power down mode, the power supply voltage at VDDC may be reduced to save power but not removed. Power supply voltage terminal VDD is coupled to receive a positive power supply voltage that is provided during normal mode but removed from most of integrated circuit 10 during power down mode. Power supply voltage terminal VSS is coupled to ground in the illustrated embodiment. Note that in other embodiments, the power supply voltages may be different. For example, VDD and VDDC may be provided with a negative power supply voltage.

Figure 3:
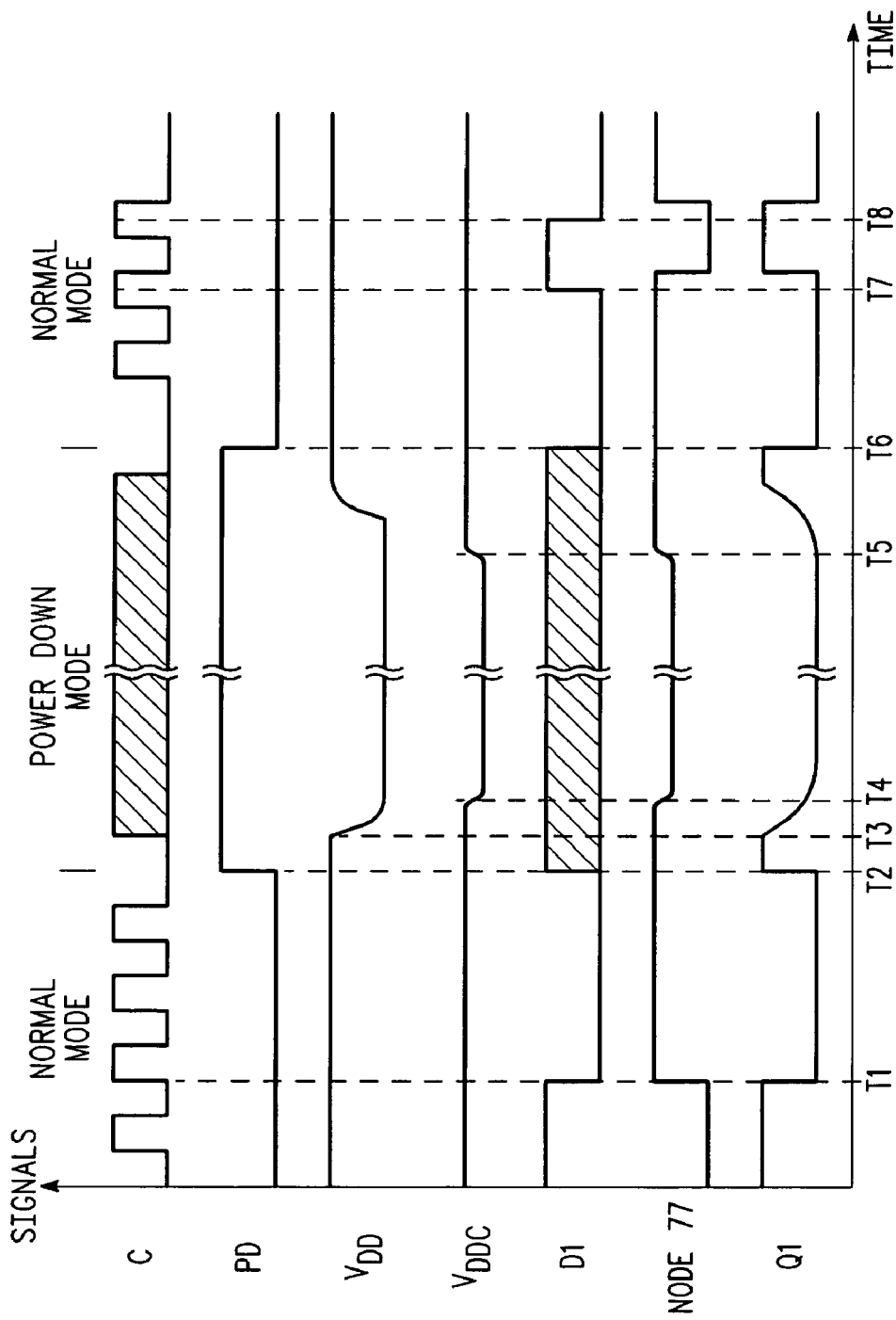
FIG. 3 illustrates a timing diagram of various signals of the data path of FIG. 2.

FIG. 3 illustrates a timing diagram of various signals of data path 16 of FIG. 1 and FIG. 2.

Note that in FIG. 3, cross-hatched areas indicate when the logic state of a signal does not matter. During this time, these signals may be at the potential of VDD, VSS, or somewhere in between.

During a normal operating mode, labeled "NORMAL MODE" in FIG. 3, latches 30 and 32 may be part of a slave latch for a master-slave flip-flop. Clock signal C is toggling between logic high and logic low states. Power down signal PD is a logic low and power supply voltages are being provided to power supply voltage terminals VDD and VDDC. At time T1, input signal D1 transitions from a logic high to a logic low while clock signal C is a logic high. The logic low passes through input circuit 12 and transmission gate 26 to node 27 while clock signal C is a logic high. The logic state at node 27 then rises to a logic high (if the input circuit 12 is an inverter) in response to the falling logic state of D1 at time T1. Also, the output signal Q1 is provided at the output of inverter 22 at time T1 when clock signal C is a logic high. In the illustrated embodiment, signal Q1 is provided having the same logic state as input signal D1. However, in other embodiments, it may be necessary to provide Q1 as a logical complement of signal D1. To do this, the inverter 12 or 22 may, for example, be omitted or a second inverter added in series with inverter 12 or 22. Note that propagation delays are not taken into account in FIG. 3.

Also, during the normal mode, the logic state of node 27 is retained by latch 30 and low power latch 32 as can be seen at time T2 and the signal at node 77. Because control signal PD is a logic low during the normal operating mode, transmission gate 39 is conductive during normal mode. Transmission gate 80 is non-conductive during normal mode. The pair of cross-coupled inverters 76 and 78 store the logic state provided to node 27 when clock signal C becomes a logic low. Transmission gate 82 is conductive each time clock signal C is a logic low, thus causing the contents of latch 32 to hold the logic state while the clock is low. Also, latch 30 stores the logic state of node 27 at about the same time. However, because latch 30 is implemented with faster, higher leakage transistors with lower threshold voltages, latch 30 can operate at a higher frequency than latch 32. At time T1, the logic state of node 77 becomes a logic high at about the same time that Q1 becomes a logic low if propagation delays are ignored. Note that in the illustrated embodiment, the transmission gates are implemented conventionally with parallel-connected P-channel and N-channel transistors that are controlled using complementary signals. In other embodiments, the transmission gates may be implemented as single transistors that receive one single-ended control signal.

During a low power operating mode, labeled "POWER DOWN MODE" in FIG. 3, the power down signal PD is asserted as a logic high as illustrated at time T2 in FIG. 3. The transmission gate 39 becomes non-conductive, and functions to isolate the pair of inverters 76 and 78 from the rest of the circuit. Transmission gate 80 becomes conductive, coupling the input of inverter 76 to the output of inverter 78 so that the logic state stored by inverters 76 and 78 is maintained during the power down mode. Control signal PDK becomes a logic high, causing latch 30 to be disabled. The input signal D1 is "don't care" during power down, as illustrated in FIG. 2, because latches 30 and 32 are isolated from the input circuit 12 by transmission gate 26. The clock signal C is stopped as a logic low at the beginning of the power down mode. During power down, the state of clock signal C can float as illustrated in FIG. 3. Transmission gate 82 may be conductive or non-conductive, since transmission gate 80 will guarantee that cross-coupled latch 32 is latched and transmission gate 39, being non-conductive, guarantees that latch 32 is isolated from node 27. In the illustrated embodiment, VSS is at ground potential.

Also during the low power mode, the power supply voltage VDD is removed, or turned off, after a period of time at time T3. The period of time is necessary to allow signal PD to propagate to all transistors before VDD is removed. In addition, as illustrated in FIG. 3 at time T4, the power supply voltage VDDC may be reduced to further reduce the leakage current of the slave latch. To return to normal mode, at time T5, the power supply voltages VDD and VDDC are returned to the normal mode voltage levels. Then at time T6, the power down signal PD is returned to a logic low. Between times T6 and T8, the integrated circuit is illustrated functioning again in normal mode.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, the illustrated elements of circuit 10 are circuitry located on a single integrated circuit or within a same device. Alternatively, circuit 10 may include any number of separate integrated circuits or separate devices interconnected with each other.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit, comprising:
   a first latch having an input/output coupled to a data node, a clock terminal for receiving a clock signal, and a control terminal for receiving a control signal;
   a second latch having an input/output and a clock terminal for receiving the clock signal;
   a coupling circuit is coupled between the input/output of the second latch and the data node and is enabled during a normal operation of the circuit and disabled during a power down mode of the circuit; and
   a power down control circuit for providing the control signal, the control signal for disabling the first latch for a time period after a transition from the power down mode to the normal operation by preventing a power supply voltage from being provided to the first latch until after the time period.

2. The circuit of claim 1, wherein the first latch comprises transistors having a lower threshold voltage than transistors that comprise the second latch.

3. The circuit of claim 1, wherein:
   the first latch is characterized as having a first write time; and
   the second latch is characterized as having a second write time, wherein the first write time is faster than the second write time.

4. The circuit of claim 1, wherein the second latch comprises transistors having a lower current leakage than transistors that comprise the first latch.

5. The circuit of claim 1, wherein the first latch has the power supply voltage removed during the power down mode and restored the time period after the transition from the power down mode to the normal operation.

6. The circuit of claim 1, wherein:
   in the normal operation, the first latch and the second latch alternate between being written and latching in response to a clock signal switching between first and second logic states, respectively; and
   the time period is a duration of the first logic state immediately following the transition from the power down mode to the normal operation.

7. The circuit of claim 1, wherein:
   the clock signal has cycles divided into first half cycles and second half cycles, wherein the clock signal is in a first logic state during the first half cycles and in a second logic state during the second half cycles;
   the first and second latches receive data present on the data node during the first half cycles and keep the data in a latched condition during the second half cycles; and
   the time period is a duration of the first time period immediately following the transition from the power down mode to the normal operation.

8. The circuit of claim 1, wherein:
   the power down control circuit comprises a set/reset latch having a set input for receiving a signal that is active in response to a transition from normal operation to the power down mode, a reset input for receiving the clock signal, and an output; and the first latch has an input coupled to the output of the set/reset latch.

9. The circuit of claim 8, further comprising:
an input circuit having an output;
coupling means for coupling, responsive to the clock signal, the output of the input circuit to the data node; and
an output circuit having an input coupled to the data node.

10. The circuit of claim 9, wherein:
the clock signal has cycles divided into first half cycles and second half cycles, wherein the clock signal is in a first logic state during the first half cycles and in a second logic state during the second half cycles;
the first and second latches receive data present on the data node during the first half cycles and keep the data in a latched condition during the second half cycles;
the reset input is active in response to the first logic state.

11. The circuit of claim 10, wherein the clock signal is at a beginning of a second half cycle that is extendible when a transition from the power down mode to the normal operation occurs.

12. The circuit of claim 11, wherein the power down control circuit further comprises a plurality of data nodes having pairs of keeper latches coupled thereto, wherein each pair has one keeper latch for receiving the control signal.

13. A circuit having a normal mode and a power down mode, comprising:
a first input circuit having an output;
a first transmission gate enabled by a clock signal having a first terminal coupled to the output of the first input circuit and a second terminal;
a first latch powered during the normal mode and unpowered during the power down mode having an input/output coupled to the second terminal of the first transmission gate, a clock input for receiving a clock signal, and an enable input for receiving a control signal;
a second transmission gate that is enabled during the normal mode and disabled during the power down mode having a first terminal coupled to the second terminal of the first transmission gate and a second terminal;
a second latch enabled during power down mode and during normal mode having an input/output coupled to the second terminal of the second transmission gate; and
a power down control circuit for providing the control signal to the enable input of the first latch to keep the first latch disabled by preventing a power supply voltage from being provided to the first latch until after a time period after a transition from the power down mode to the normal mode.

14. The circuit of claim 13, wherein;
the first latch comprises transistors having a first threshold voltage; and
the second latch comprises transistors having second threshold voltage greater than the first threshold voltage.

15. The circuit of claim 13, wherein;
the first latch has a first write speed; and
the second latch has a second write speed slower than the first write speed.

16. The circuit of claim 13, wherein:
the first latch comprises transistors characterized as having a first current leakage; and
the second latch comprises transistors characterized as having a second current leakage that is less than the first current leakage.

17. The circuit of claim 13, further comprising:
a second input circuit having an output;
a third transmission gate enabled by the clock signal having a first terminal coupled to the output of the second input circuit and a second terminal;
a third latch powered during the normal mode and unpowered during the power down mode having an input/output coupled to the second terminal of the third transmission gate and an enable input;
a fourth transmission gate that is enabled during the normal mode and disabled during the power down mode having a first terminal coupled to the second terminal of the third transmission gate and a second terminal; and
a fourth latch enabled during power down mode and during normal mode having an input/output coupled to the second terminal of the fourth transmission gate, wherein:
the power down control circuit provides the power down keep signal coupled to the enable input of the third latch to keep the third latch disabled until after the time period after the transition from the power down mode to the normal mode.

18. In a circuit having a normal mode and a power down mode and having a first latch and a second latch, a method comprising:
writing data into the first latch and the second latch through a data node during a first half cycle of a clock signal that occurs during the normal mode;
latching data from the data node in the first latch and the second latch during a second half cycle of the clock signal that occurs during the normal mode;
disabling the first latch by removing a power supply voltage from the first latch in response to entering the power down mode;
keeping the data latched in the second latch during the power down mode and a time period after a transition from the power down mode to the normal mode; and
enabling the first latch after a time period after the transition from the power down mode to the normal mode by reapplying the power supply voltage to the first latch in response to a control signal, the control signal provided to the first latch after the time period.

19. The method of claim 18, wherein the step of enabling is further characterized by the time period being the duration of the second half cycle which is extendible after the transition from the power down mode to the normal mode.

20. The method of claim 18, further comprising:
providing the control signal in response to a power down signal, the power down signal for causing the circuit to transition between the normal mode and the power down mode.

* * * * *